United States Patent
Aggarwal (10) Patent No.: US 9,136,825 B2
(45) Date of Patent: Sep. 15, 2015

(54) METHOD AND DEVICE FOR IMPLEMENTING TRACKING FILTERS AND RF FRONT END OF SOFTWARE DEFINED RADIOS

(75) Inventor: Sudhir Aggarwal, Fremont, CA (US)

(73) Assignee: Nokia Technologies Oy, Espoo (FI)

( * ) Notice: Subject to any disclaimer, the term of this patent is extended or adjusted under 35 U.S.C. 154(b) by 301 days.

(21) Appl. No.: 13/495,489

(22) Filed: Jun. 13, 2012

(65) Prior Publication Data

US 2013/0336342 A1  Dec. 19, 2013

(51) Int. Cl.
*H04L 27/20* (2006.01)
*H03H 19/00* (2006.01)

(52) U.S. Cl.
CPC .................................. *H03H 19/002* (2013.01)

(58) Field of Classification Search
None
See application file for complete search history.

(56) References Cited

U.S. PATENT DOCUMENTS

| | | | | |
|---|---|---|---|---|
| 3,603,898 | A | | 9/1971 | Dawson et al. ............. 330/70 A |
| 5,491,453 | A | * | 2/1996 | Ichihara ........................ 327/553 |
| 5,525,940 | A | * | 6/1996 | Heikkila et al. ............. 333/17.1 |
| 5,724,000 | A | | 3/1998 | Quinn ........................... 327/554 |
| 8,149,742 | B1 | * | 4/2012 | Sorsby .......................... 370/278 |
| 2004/0095951 | A1 | * | 5/2004 | Park .............................. 370/437 |
| 2008/0136473 | A1 | | 6/2008 | Bollenbeck et al. .......... 327/156 |
| 2009/0002066 | A1 | | 1/2009 | Lee et al. ...................... 327/554 |
| 2011/0075593 | A1 | * | 3/2011 | Chen et al. .................... 370/280 |
| 2012/0214435 | A1 | * | 8/2012 | Javor et al. .................... 455/141 |

FOREIGN PATENT DOCUMENTS

GB   1 341 182   12/1973

OTHER PUBLICATIONS

Darvishi et al., "A 0.3 to 1.2GHz Tunable $4^{th}$—Order Switch gm-C Bandpass Filter with >55dB Ultimate Rejection and Out-of-Band IIP3 of +29dBm", 2012 IEEE International Solid-State Circuits Conference, ISSCC , Apr. 2012, Session 21, Analog Techniques, 21.1.
Ghaffari, Amir, Tunbale High-Q N-Path Band-Pass Filers, May 2011, IEEE, Journal of Solid-State Circuits, vol. 46, pp. 1-12.

* cited by examiner

*Primary Examiner* — Chirag Shah
*Assistant Examiner* — Daniel Mitchell
(74) *Attorney, Agent, or Firm* — Harrington & Smith (57) ABSTRACT

A tracking circuit has first and second filters controlled by clock signals and a combiner. Each filter has N paths in parallel between an input and an output, each path comprising a respective first/second sub-circuit and a switch (N is an integer >1). The clock signals selectively control each of the N switches of the first and second filters at a same frequency, and in variously described embodiments the first and second on-time durations may be different, the first and second sub-circuits may be different, or both first/second on-time durations and first/second sub-circuits may be different. Signals output from the first and second filter are added at a combiner. In certain examples each path in the first and second filter is controlled by same-phase clock signals, and every path on either filter are controlled with different-phase clock signals.

20 Claims, 7 Drawing Sheets

602: provide a circuit comprising a first filter and a parallel second filter, each filter comprising a plurality of N paths in parallel between an input and an output, and each of the N paths comprising a sub-circuit and a switch (first sub-circuit for first filter, second sub-circuit for second filter)

604: selectively control a switch in the first filter and a switch in the second with clock signals having a same frequency and a same phase and respective first/second on-time durations (at least one of: first/second on-time durations are different, and first/second sub-circuits are different)

606: additively combine signal outputs of the first filter and of the second filter 608: controlling the switches at 604 further includes: controlling all the switches of the N paths in the first filter with clock signals having the same frequency and the same first on-duration and a different phase 610: the first and second on-time durations are different, and all the switches of the N paths in the second filter are controlled with clock signals having the same frequency and a same second on-duration and a different phase, such that each switch in the first filter is paired with one of the switches in the second filter by clock signals having a common phase

METHOD AND DEVICE FOR IMPLEMENTING TRACKING FILTERS AND RF FRONT END OF SOFTWARE DEFINED RADIOS

TECHNICAL FIELD

The exemplary and non-limiting embodiments of this invention relate generally to wireless communication systems, methods, devices and computer programs and, more specifically relate to radio-frequency filters such as tracking filters, bandpass and notch filters.

BACKGROUND

Software defined radios offer the promise of wider capability in a smaller hardware footprint. This has become more important in cellular handsets as customers demand a wider variety of radio capabilities in a single mobile terminal while still expecting it to fit neatly in a pocket. Such multi-band radios operate over a wide range of frequencies to implement multi-mode and multi-band radios for cellular and data connectivity applications. However, current technological limitations have prevented realization of widely tunable radio-frequency (RF) front-end circuits for multi-band radios. Such multi-band radios are increasingly required by certain cellular radio access technologies (RAT) such as evolved Universal Terrestrial Radio Access Network (E-UTRAN, also known as long term evolution or LTE).

In the typical RF front-end, the first component after the antenna is the multi-band switch/diplexer followed by the duplexer. The duplexer is used to isolate the transmitted and received signal for the antenna. The transmit signal has a very high power, up to 33 dBm, while receiver is required to pick up signal as low as −109 dBm. Therefore, the transmit power has to be isolated from the receiver even though it is operating in a different frequency band. The transmit and receive frequencies are typically not widely separated so about 50 dB of isolation is required. This is usually done by using a surface acoustic wave (SAW) filter that operates over a limited band of frequencies. While a SAW filter may be sufficient for limited bands in for example UTRAN, the inventor considers it too cumbersome, costly, large, narrowband and inefficient (insertion loss of 2-3 dB directly impacts receiver sensitivity and noise figure) for use in more advanced RATS like LTE.

Other relevant teachings may be seen at U.S. Pat. No. 3,603,898 by John H. D. Chelmsford et al.; UK Patent 1,341, 182 by Michael A. Kaufman; and a paper by Milad Darvishi et al. at section 21.1 (Analog Techniques, pages 358-359) of 2012 IEEE International Solid State Circuits Conference.

SUMMARY

According to a first exemplary aspect the invention there is a circuit comprising:
a first filter comprising a plurality of N paths in parallel between an input and an output, each of the N paths comprising a first sub-circuit and a switch;
a second filter comprising a plurality of N paths in parallel between an input and an output, each of the N paths comprising a second sub-circuit and a switch;
clock signals to selectively control switches of the first filter at a same frequency for a first on-time duration, and to selectively control switches of the second filter at the same frequency for a second on-time duration, where at least one of a) the first and second on-time durations are different, and b) the first and second sub-circuits are different; and
a combiner for adding signals from the output of the first filter and from the output of the second filter.

Detailed further below are more specific example embodiments of the above first exemplary aspect. For example, in one embodiment the clock signals that selectively control all the switches of the N paths in the first filter have the same frequency and the same first on-duration and a different phase. In another embodiment that may be combined with this one the first and second on-time durations are different, and the clock signals that selectively control all the switches of the N paths in the second filter have the same frequency and the same second on-duration and a different phase such that each switch in the first filter is paired with one of the switches in the second filter by clock signals having a common phase.

In one such embodiment the circuit may further include a splitter for applying a same input signal to the input of the first filter and the input of the second filter.

In one specific example set forth in detail below, N=4 and there are a total of four different phases of the clock signal selectively controlling the switches in the first filter and the switches in the second filter. Also below are specifically shown an embodiment in which the first sub-circuit in each path of the first filter is identical to the second sub-circuit in each path of the second filter; and another embodiment in which the first sub-circuit in each path of the first filter is different from the second sub-circuit in each path of the second filter. These sub-circuits may be embodied for example as a capacitor or a RC sub-circuit or a LC sub-circuit or a RLC sub-circuit, to name a few non-limiting embodiments. In embodiments where the first and second sub-circuits are different, the first and second on-time durations may be identical in one embodiment or they may be different in another embodiment.

Also below are given non-limiting examples of practical deployments of such a circuit, such as operatively disposed in a radio device between an antenna and one of a receiver and a transmitter; and/or embodied in a RF front end chip, and/or more generally as part of an electronic radio device.

According to a second exemplary aspect the invention there is a method comprising: providing a circuit comprising a first filter and a parallel second filter, each filter comprising a plurality of N paths in parallel between an input and an output, and each of the N paths comprising a sub-circuit and a switch (the sub-circuit in the first filter is a first sub-circuit and the sub-circuit in the second filter is a second sub-circuit); controlling a switch in the first filter and a switch in the second filter with clock signals having a same frequency and a same phase and respective first and second on-time durations, where at least one of a) the first and second on-time durations are different, and b) the first and second sub-circuits are different; and then additively combining signal outputs of the first filter and of the second filter.

Also detailed further below are more specific example embodiments of the above second exemplary aspect. For example, controlling the switch in the first filter and the switch in the second filter with the clock signals is in one non-limiting example done by controlling all the switches of the N paths in the first filter with clock signals having the same frequency and the same first on-duration and a different phase. In a more detailed embodiment the first and second on-time durations are different, and controlling the switch in the first filter and the switch in the second filter with the clock signals may also include controlling all the switches of the N paths in the second filter with clock signals having the same frequency and the same second on-duration and a different phase such that each switch in the first filter is paired with one of the switches in the second filter by clock signals having a common phase.

In the specific example set forth in detail below where N=4, there are a total of four different phases of the clock signal selectively controlling the switches in the first filter and the switches in the second filter.

Also below are specifically shown an embodiment in which the respective first and second sub-circuits in each path of the respective first filter and second filter are identical, and another embodiment the first sub-circuit in each path of the first filter is different from the second sub-circuit in each path of the second filter.

As with the first aspect, for this second aspect also there are detailed practical deployments of the circuit as being operatively disposed in a radio device between an antenna and one of a receiver and a transmitter, and/or embodied in a RF front end chip, and/or more generally as part of an electronic radio device.

According to a third exemplary aspect the invention there is a circuit comprising first and parallel second filter means, controlling means and combining means. Each of the first and second filter means is for providing a plurality of N paths in parallel between respective input means and output means, and each of the N paths comprises a sub-circuit and switching means. Similar to the second aspect noted above, in this third aspect the sub-circuit in the first filter means is a first sub-circuit and the sub-circuit in the second filter means is a second sub-circuit. The controlling means is for controlling the switching means in the first filter means and for controlling the switching means in the second filter means with clock signals having a same frequency and a same phase and respective first and second on-time durations, in which at least one of a) the first and second on-time durations are different, and b) the first and second sub-circuits are different. The combining means is for additively combining signal outputs of the first filter means and of the second filter means.

In one particular embodiment of the third exemplary aspect above: the first filter means comprises a first filter comprising a plurality of N paths in parallel between an input and an output, and each of the N paths comprising the first sub-circuit and a switch; the second filter means comprises a second filter comprising a plurality of N paths in parallel between an input and an output, and each of the N paths comprising the second sub-circuit and a switch; the controlling means comprises a digital controller; and the combining means comprises at least one logic gate such as for example an AND gate or a NAND gate.

These and other aspects are detailed further below.

DETAILED DESCRIPTION

The SAW type filter may have several disadvantages which make it not suitable for use in the RF front end of a software defined radio. In addition to those drawbacks noted in the background section above, SAW filters may occupy too much of the PCB area which impacts the form factor of the host mobile device. And in addition to transmitter leakage, SAW filters may not sufficiently suppress other blocking signals in the frequency-vicinity of the desired signals, which of course are more prevalent in multi-band and multi-mode smart-phones.

Proposed replacements for the SAW filter include a Q-enhanced LC resonator and an N-path filter (N being an integer greater than one). The Q-enhanced inductor-capacitor LC resonator filters the blocking signals by using inductors. But this may be possible for only a narrow band of frequencies and it is used for single-band radios, and so may be generally not any more suitable for wideband multi-radio devices than SAW filters. The other category filters blocking signals by using feedback or feed-forward translational loop by making use of an N-path filter as a transferred impedance filter (TIF).

Figure 1:
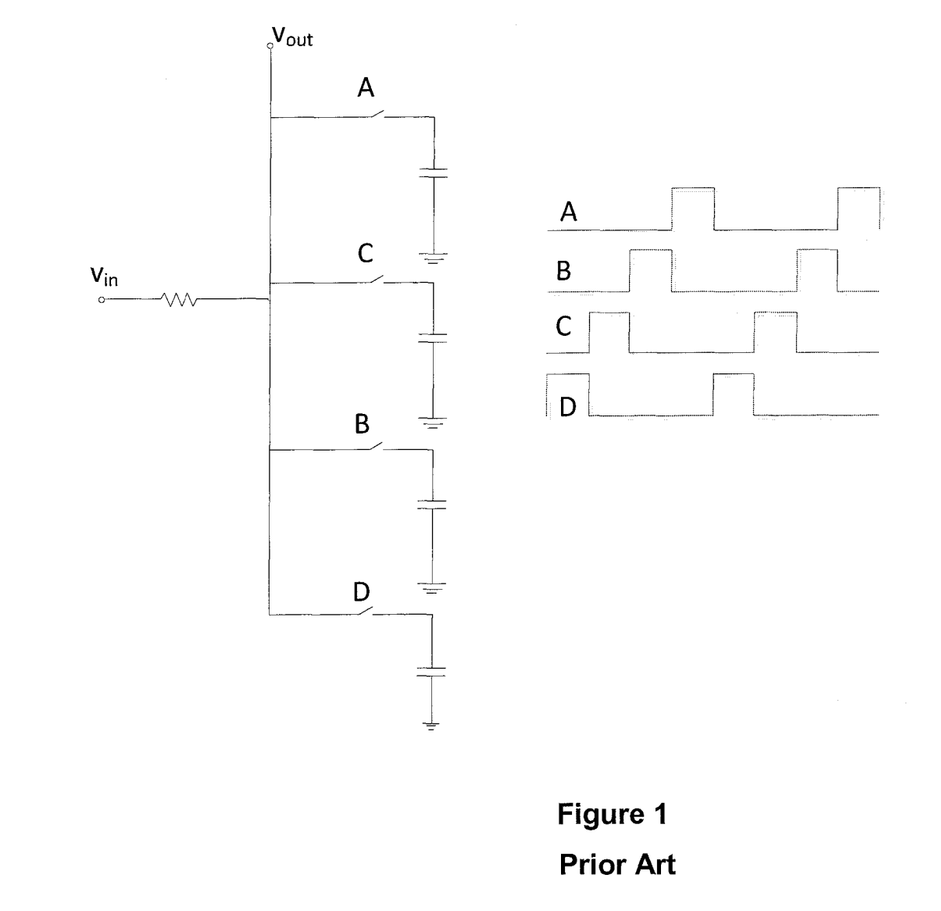
FIG. 1 is a rendition of a prior art four-phase capacitive filter used as an N-path filter.

FIG. 1 is a circuit schematic illustrating in general a conventional N-path filter, using capacitors switched with a four-phase clock. This filter may be used as a tracking filter because the band pass characteristics at the local oscillator (LO) frequency may be made to track by varying the frequency. For this type of filter, out-of-band rejection is limited to only about 15 dB. Noise folding and on-resistances of the switches stand as two of the practical limitations for achieving a higher rejection than that.

One may improve the filter rejection further over FIG. 1 by employing two filters with their center frequency tuned to a slightly different value but having the same bandwidth. These filters may then have a second order response with a rejection slope of 20 db/decade. Subtracting the response of these two filters may yield a fourth order filter with a rejection slope of 40 dB/decade. In this configuration, the limitation of achievable rejection by the switch resistances may also be reduced because in the ideal case the effect of the switch resistances also cancels. For the subtraction based filter, the rejection may be a function of mismatch in switch resistances.

In the case of four phase tracking filters, there are different ways to make the center frequency different. The difference in center frequencies may be enabled by having two sets of four phase clock generators differing slightly in the frequency. They may have a tendency to pull towards each other. Another possibility for differing center frequencies is to use 16-phase switched capacitors, but this adds to complexity and folding of the blockers at the sixteenth multiple of the clocks. A third technique for enabling different center frequencies is to use poly-phase gm cells in the baseband region to shift the admittance frequency. But this is seen to add considerable noise of transconductances, rendering the filter not very useful at RF frequencies.

Figure 2:
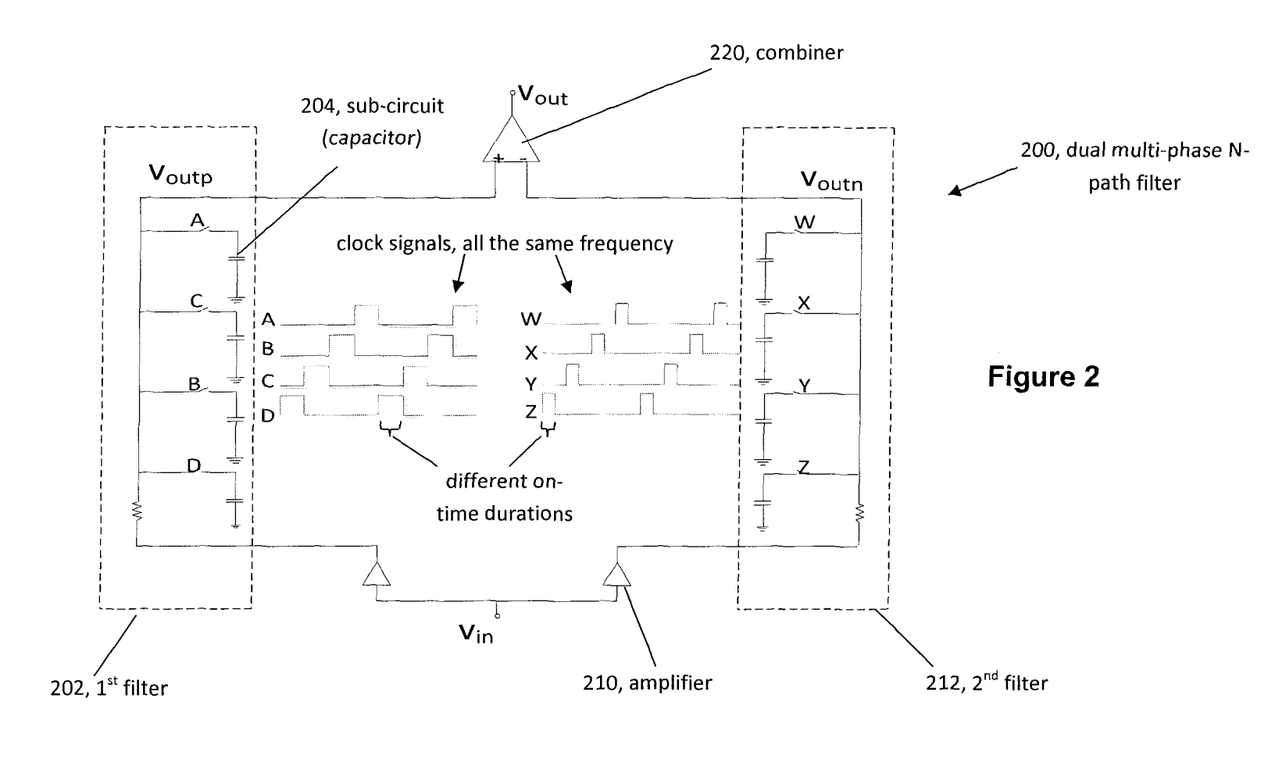
FIG. 2 is a schematic circuit diagram of a dual N-path tracking filter according to an exemplary embodiment of these teachings.

These teachings take a different approach. Rather than two filters with shifted center frequencies, FIG. 2 illustrates an exemplary embodiment of a tracking filter implemented as two four-phase N-path filters all running on the same frequency. This is but one arrangement; there may be more or less than four paths/phases, and/or there may be more than two N-path filters in parallel in other implementations. A high out-of-band rejection may be obtained not by shifting the center frequency but by shifting the amplitude of the response at the center frequency and then taking the difference of filter responses as the final output response. The amplitude of the filter response may be shifted by varying the on-time of the each active phase of the clock.

At FIG. 2 the two filters 202, 212, which may also be termed branches of the overall filter 200, each have N=4 paths, each path having a switch and a capacitor. In other embodiments the capacitor may be replaced by series or parallel components, such as an RC (resistor-capacitor) sub-circuit, an LC (inductor-capacitor) tank sub-circuit, an RLC (resistor-inductor-capacitor) sub-circuit, or combinations of any of those alternatives to name a few non limiting examples. In general we can refer to each path as defining a sub-circuit 204 which is switched into and out of the respective filter/branch 202, 212, and in the example tracking circuit of FIG. 2 all of those sub-circuits 204 are identical.

Consider the first filter 202; there may be four switches A, B, C and D, each on a different path and each selectively controlled by the same clock signal but at different phases. This is shown in the clock signal profile at FIG. 2 adjacent to the first filter 202; clock signal A controls the switch A, clock signal B controls the switch B, etc. Since each path of a given filter 202, 212 is switched open and closed by the same clock signal but at different phases, the switches and thus the N paths may operate on identical frequencies. The clock signal profiles for paths A, B, C and D also show they each have the same on-time, meaning the amplitude of the signal when any one of these paths is switched closed is the same as that for any other path on this same filter 202. Consider this a first on-time duration. Only the phase may differ among the paths on the same filter 202.

Now consider the second filter 212; there may be four switches W, X, Y and Z. Each of these may also be on a different path and they may also be all controlled by a single clock signal but at different phases, also as shown in the clock signal profile at FIG. 2 adjacent to the second filter 212. Like the first filter 202, in the second filter 212 the clock signal W may control switch W, clock signal X controls switch X, etc. And like the first filter 202, since each path of the second filter 212 is driven by the same clock signal they all have identical frequencies. The signal profiles for paths W, X, Y and Z also show they each may have the same on-time, meaning the amplitude of the signal when any one of these paths is switched closed is the same as that for any other path on this same filter 212. Consider this a second on-time duration. Like the first filter, only the phase differs among the paths on the same filter 212.

Now consider similar paths on the different filters 202, 212. The clock signal controlling the switches A, B, C and D of the first filter 202 may be at the same frequency as the clock signal controlling the switches W, X, Y and Z of the second filter 212. From the clock signals at FIG. 2 we see that paths A and W may be at the same phase; paths B and X may be at the same phase, paths C and Y may be at the same phase, paths D and Z may be at the same phase. The salient difference between each of these same-phase paths on the parallel filters 202, 212 may be that they are driven by different on-times, meaning the amplitude of the signal they output when that respective switch is closed differs from one another despite identical frequency, phase and sub-circuit being switched in and out of the respective filter 202, 212. According to the exemplary on-times shown at FIG. 2, for any pair of same-phase paths, signals from the path switched-in at the first filter 202 may exhibit larger amplitude than signals from the path switched-in at the second filter 212.

The output of the two individual filters/branches 202, 212 may be additively combined at 220 such that the signal amplitude from the second filter 212 may be subtracted from that of the first filter 202 to achieve the output signal $V_{out}$. The FIG. 2 implementation is for a single-ended signal, where there may be a single input signal $V_{in}$ split into two parts and each part is passed through one of the filters 202, 212 after being amplified 210.

The local oscillator providing the clock signals to all of these switches A, B, C, D, W, X, Y and Z may be tuned to different frequencies, to different on-times, and to different phases so the N-phase N-path multi filters in parallel may be tuned over quite a wide bandwidth when implemented in the RF front end chip near the antenna. The frequencies may be identical so the fact that they would pull toward each other if there were any difference may not be relevant. Since the filters are implemented in parallel there may not be added delay due to additional switching on the parallel filter.

Figure 3A:
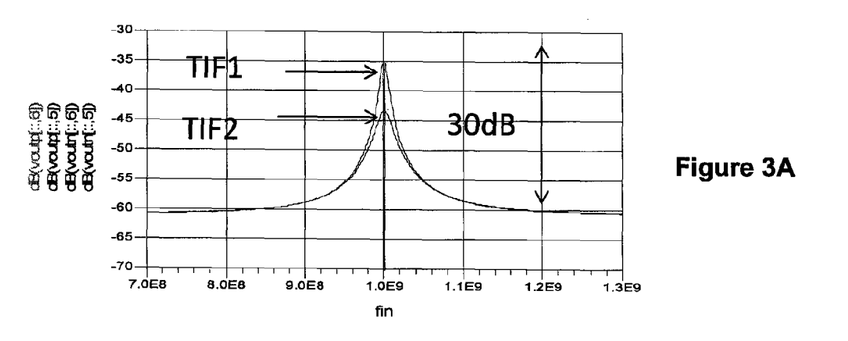
FIG. 3A plots the frequency response of the individual branches of the dual N-path tracking filter of FIG. 2.

FIG. 3A illustrates the frequency response of the two branches of the bandpass tracking filter 200 of FIG. 2 at 1 GHz for sidebands covering 300 MHz on each side of 1 GHz local oscillator/clock frequency. FIG. 3A illustrates two response curves, one for each of the two filters 202, 212, and corresponding to a clock having a duty cycle of 25% with on-time ($T_{on}$) of 23 ns and 17 ns respectively. At the center frequency the amplitudes are quite different, while both tail frequency responses are similar across both filters.

Figure 3B:
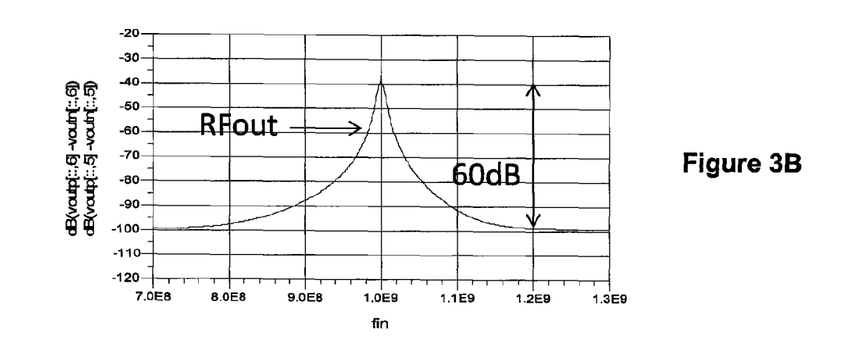
FIG. 3B plots the frequency response of the entire dual N-path tracking filter of FIG. 2 and shows its high out-of band rejection.

Taking the difference of these two FIG. 3A responses at the combiner 220 (FIG. 2) yields the total filter response illustrated at FIG. 3B. There it can be seen that the filter rejection from 700 MHz to 1 GHz is about 60 dB, whereas in the original filter response (one of the responses at FIG. 3A) it was less than 30 dB. A filter according to these teachings provides a significant improvement in the filter rejection characteristics as compared to that of FIG. 1.

Figure 4:
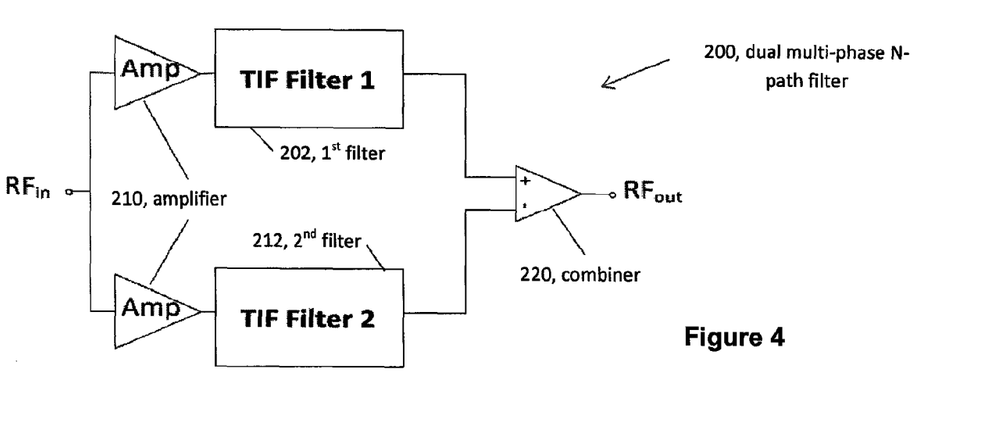
FIG. 4 is a high level circuit diagram showing that the output of the two filters of FIG. 2 are subtracted to achieve an output signal plotted at FIG. 3B.

The general principle to achieve the FIG. 3B output from the individual filter responses at FIG. 3A-B is shown in the high level circuit diagram of FIG. 4. The first 202 and second 212 filters of the dual multi-phase N-path filter 200 are shown there using the same reference numbers as FIG. 2, and also shown are the amplifiers 210 for each filter 202, 212 as well as the combiner 220 to achieve the output shown at FIG. 3B.

While FIG. 2 and the accompanying performance plots at FIGS. 2 and 3 utilized a single-ended signal (a single $V_{in}$ and $V_{out}$), the filter 200 of FIG. 2 may be easily converted in other embodiments to a differential version for differential signals at the input and/or at the output. For the case of a differential input and single-ended output, the two phases of the differential input signal may be applied to two single-ended branches without any need for splitting the input signal, and each input signal $V_{in1}$ and $V_{in2}$ may input separately to the different amplifiers 210 shown in FIG. 2. For such differential inputs and outputs, the first 202 and second 212 filters/branches may be considered to have inputs and outputs where the signal pathway penetrates the dotted lines for 202 and 212 in FIG. 2.

Figure 5A:
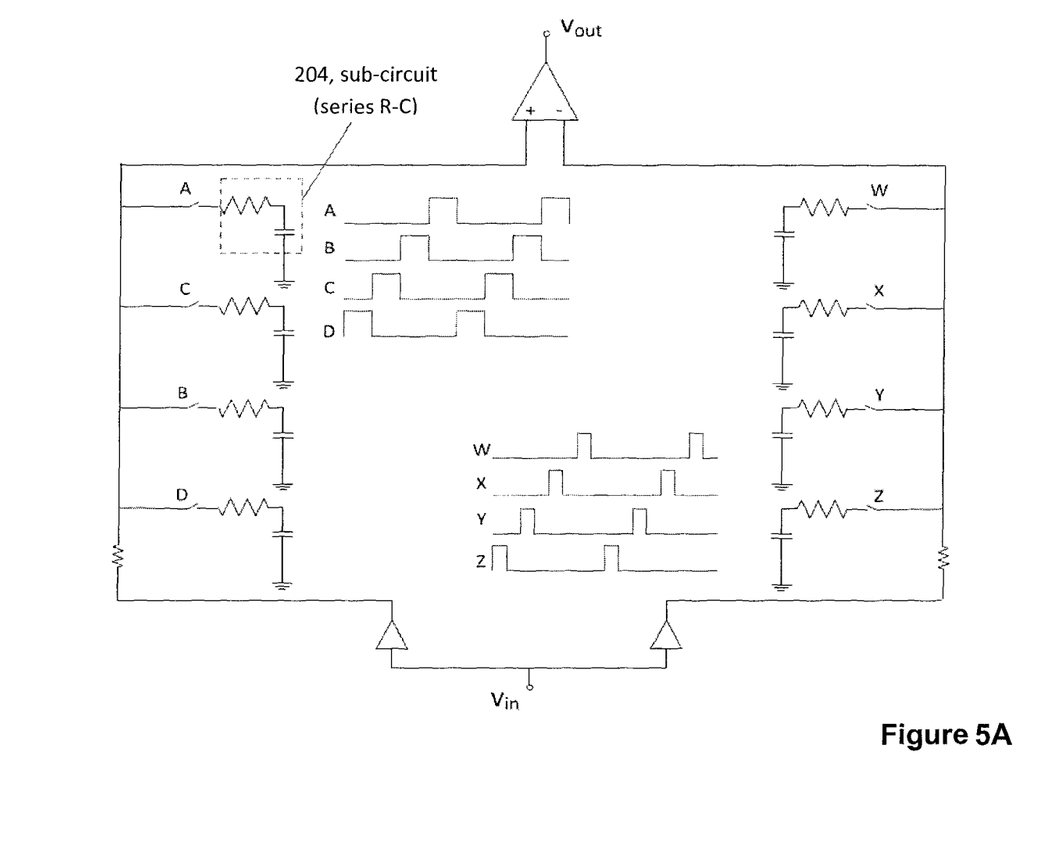
FIGS. 5A-B are schematic circuit diagrams of the dual N-path tracking filter according to further exemplary embodiments of these teachings.

FIG. 5A is an alternative embodiment of a dual N-path tracking filter according to these teachings. The FIG. 5A embodiment may be identical to that of FIG. 2 except the sub-circuit 204 each path that is switched in or out of the filter may be a series RC circuit rather than only a capacitor as in FIG. 2. As noted above other implementations of the sub-circuit 204 may be a LC circuit or a RLC circuit or other components in parallel or series.

Figure 5B:
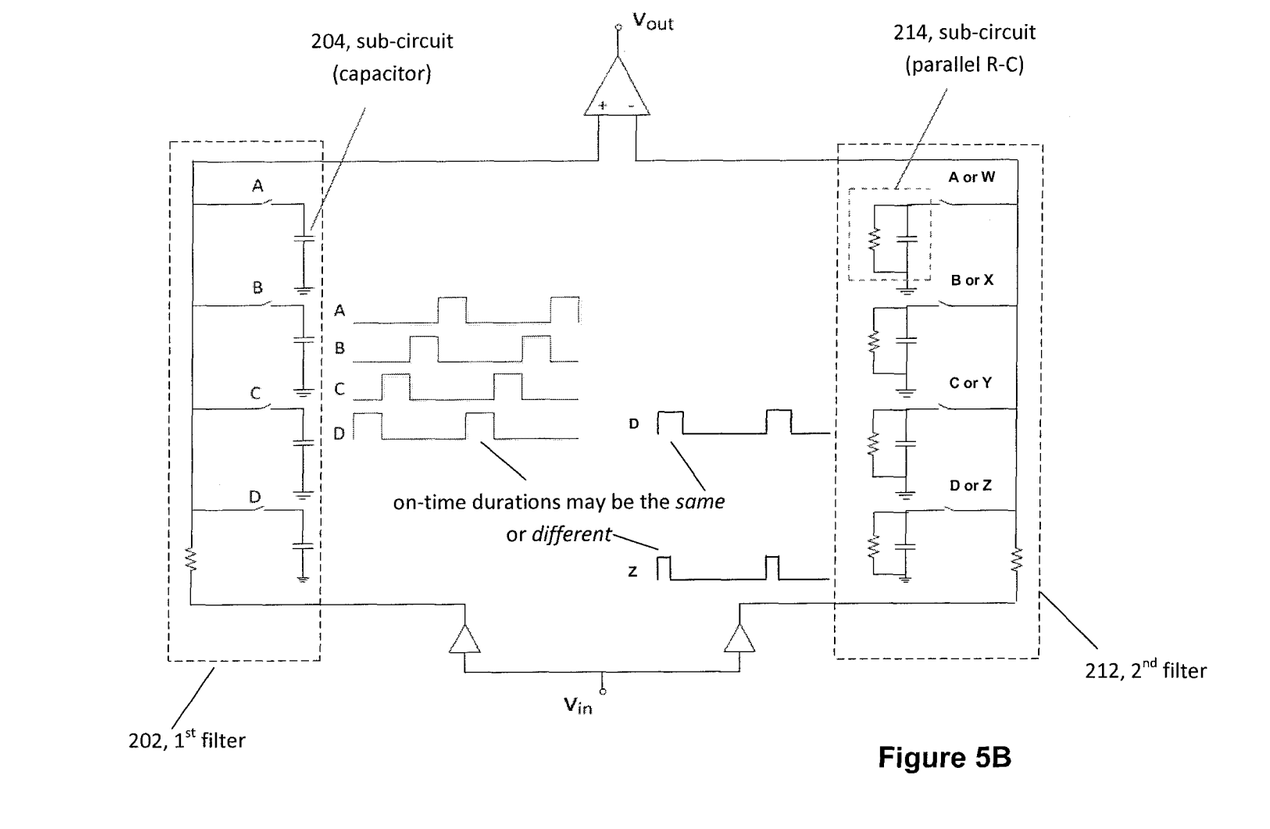

Note that in the example tracking circuits of both FIG. 2 and FIG. 5A the sub-circuits on each branch on both the first filter 202 and the second filter 212 are identical. This is not a necessary limitation for all implementations as proved by the further example tracking circuit at FIG. 5B. At FIG. 5B the sub-circuits 204 on each path of the first filter 202 are all identical to one another and shown by example as only a capacitor. For convenience we can refer to these as a first sub-circuit. The sub-circuits 214 on each path of the second filter 212 are all identical to one another and shown by example as a parallel R-C sub-circuit, and similarly for convenience we can refer to these as a second sub-circuit. FIG. 5B thus shows that the first sub-circuit 204 which is on the paths of the first filter 202 is different from the second sub-circuit 214 which is on the paths of the second filter 212.

In the FIG. 5B embodiment the on-time durations of the clock signals that control the respective first filter 202 and second filter 212 may be different as was detailed above for FIGS. 2 and 5A, but in another embodiment since the sub-circuits 204, 214 in the branches of those filters 202, 212 are different the same result as FIGS. 2 and 5A may be achieved even if the on-time durations are the same. Thus if we consider that a) for the first filter 202 there is a first sub-circuit 204 and a clock signal is applied having a first on-time duration, and b) for the second filter 212 there is a second sub-circuit 214 and a clock signal is applied having a second on-time duration, then according to the different embodiments detailed among FIGS. 2, 5A and 5B it may be that the first and second on-time durations are different, or the first and second sub-circuits are different, or both on-time durations and sub-circuits are different.

Among the technical effects of these teachings, the filter described in detail above may meet the rejection requirement same as a SAW filter but it may be integrated into the RF transceiver chips, resulting in elimination of the bulky and costly SAW filter from mobile handsets. Additionally, a filter according to these teachings may be implemented as a tracking filter rather than only a bandpass filter, in which case it may enable the implementation of multi-band radios such as required for LTE without overly burdening the form factor when designing the handset layout Some of the above principles of these teachings are summarized with reference to the process flow diagram of FIG. 6, which shows how the filter according to these teachings is operated. To avoid confusion as between the overall filter 200 and the individual parallel N-phase filters 202, 212, the overall apparatus will be referred to as a circuit. Such a circuit may be disposed in the mobile user terminal, or in the network base station, or in a local wireless hotspot, or other such radio devices. The various steps and messages summarized in FIG. 6 may be viewed as method steps, and/or as operations that result from operation of computer program code embodied on a memory and executed by a processor, and/or as a plurality of coupled logic circuit elements constructed to carry out the associated function(s).

Figure 6:
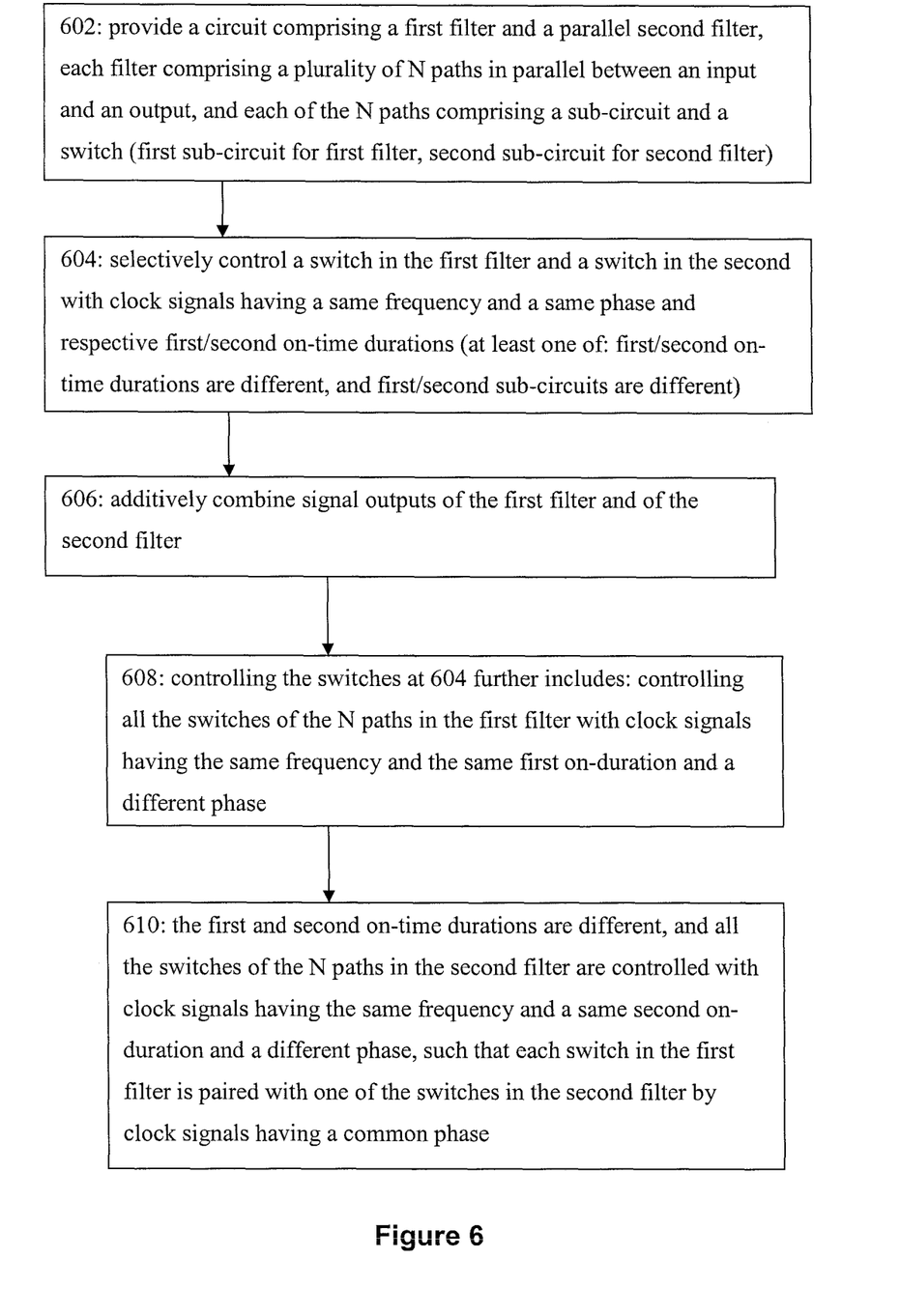
FIG. 6 is a process flow diagram that illustrates a method, and a result of execution by one or more processors of a set of computer program instructions embodied on a computer readable memory, for operating a circuit/filter in accordance with the exemplary embodiments of this invention.

At block 602 of FIG. 6 the overall circuit is provided. The circuit may comprise a first filter and a parallel second filter, each filter comprising a plurality of N paths in parallel between an input and an output, and each of the N paths comprising a sub-circuit and a switch. Sub-circuits in the first filter are referred to as first sub-circuits, while sub-circuits in the second filter are referred to as second sub-circuits. Then at block 604 a switch in the first filter and a switch in the second filter may be selectively controlled with clock signals having a same frequency and a same phase and respective first and second on-time durations. As was detailed by the above examples, a) the first and second on-time durations may be different, b) the first and second sub-circuits may be different, or c) both on-time duration and sub-circuits may be different. Block 604 recites this as 'at least one of' the options a) and b) immediately above. Then at block 606 the signal outputs of the first filter and of the second filter are additively combined.

Further portions of FIG. 6 summarize some of the more particular aspects of the above examples and are not limiting to the broader teachings herein. Block 608 gives further detail for block 604, namely that selectively controlling the switches in the first and second filters may comprise controlling all the switches of the N paths in the first filter with clock signals having the same frequency and the same first on-duration and a different phase. Block 610 extends this to the second filter also for the case in which the first and second on-time durations are different, namely that all the switches of the N paths in the second filter may be controlled with clock signals having the same frequency and the same second on-duration and a different phase, such that each switch in the first filter is paired with one of the switches in the second filter by clock signals having a common phase.

In the description above one deployment was to dispose this circuit in a mobile handset, or even in a network node such as a base station or access point (more generally an electronic radio device), between an antenna and one of a receiver and a transmitter. When used as a tracking filter it may advantageously be embodied in CMOS on a RF front end chip.

Figure 7:
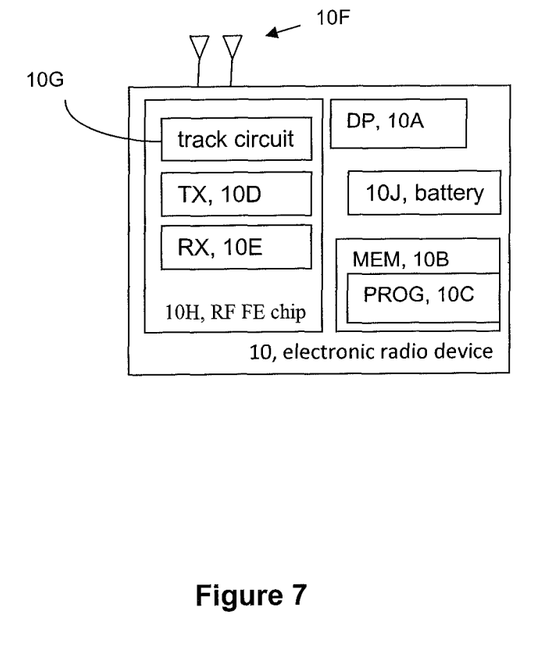
FIG. 7 is a simplified block diagram of an exemplary electronic device, such as a user equipment UE or a network access node, which is suitable for use in practicing the exemplary embodiments of the invention.

Reference is made to FIG. 7 for illustrating a simplified block diagram of an electronic device suitable for embodying a filter circuit according to these teachings. For example, such an electronic radio device may be a mobile phone/user terminal more generally referred to as a user equipment (UE), or it may be a network access node such as a Node B (base station), an eNB, or a local area network access point.

For example, a UE may be any portable radio device intended for an end user which accesses a wireless network such as a cellular or WLAN network. Specific examples of a UE include but are not limited to: cellular telephones, personal digital assistants (PDAs) having wireless communication capabilities, portable computers (laptops, tablets, etc.) having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

Embodiments of a network access node include but are not limited to cellular base stations, relay stations, remote radio heads, WLAN access points, and any other type of network node with wireless communication capability and which serves as an access portal enabling any of the above types of UEs to gain access to the wireless network of whatever specific type of radio access technology.

The device 10 may include a controller, such as a computer or a data processor (DP) 10A, a computer-readable memory medium embodied as a memory (MEM) 10B that stores a program of computer instructions (PROG) 10C, and a suitable radio frequency (RF) transmitter (TX) 10D and receiver (RX) 10E for bidirectional wireless communications over the air via one or more antennas 10F (two shown). The device 10 may have one or more than one radios 10D/10E for communicating with other radio devices or the same or different type. The circuit shown by example in FIGS. 2 and 5 above is shown in FIG. 7 as a tracking circuit 10G, disposed on the RF front end (FE) chip 10H between the antennas 10F and the transmitter or receiver. Particularly when embodied within a UE but also in case there is a backup DC power supply for a network access node, the electronic device in which such a tracking circuit 10G may be disposed may also be powered by a portable power supply 10J such as a battery or a fuel cell for example.

Since this circuit may be deployed in a software defined radio, at least one of the PROGs 10C may be assumed to include program instructions that, when executed by the associated DP, enable the device to operate in accordance with the exemplary embodiments of this invention, as detailed above. That is, the exemplary embodiments of this invention may be implemented at least in part by computer software executable by the DP 10A of the device 10, or by hardware, or by a combination of software and hardware (and firmware). For the software defined radio, the parameters for driving the local oscillator to provide the appropriate clock signal for controlling the switches so as to set the center frequency and suitable band exclusion cutoffs may be stored in the memory and applied to the local oscillator according to a program which selects from the memory, the appropriate parameter set for a given radio and the frequencies being used.

For completeness, the computer readable MEM 10B may be of any type suitable to the local technical environment and may be implemented using any suitable data storage technology, such as semiconductor based memory devices, flash memory, magnetic memory devices and systems, optical memory devices and systems, fixed memory and removable memory. The DP 10A may be of any type suitable to the local technical environment, and may include one or more of general purpose computers, special purpose computers, microprocessors, digital signal processors (DSPs) and processors based on a multicore processor architecture, as non-limiting examples.

In general, the various exemplary embodiments may be implemented in hardware or special purpose circuits, software, logic or any combination thereof. For example, some aspects may be implemented in hardware, while other aspects may be implemented in embodied firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, embodied software and/or firmware, special purpose circuits or logic, general purpose hardware or controller or other computing devices, or some combination thereof, where general purpose elements may be made special purpose by embodied executable software.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

While the exemplary embodiments have been described above in the context of an E-UTRAN multi-radio/software-defined radio device, it should be appreciated that the exemplary embodiments of this invention are not limited for use with only this one particular type of wireless communication system that uses resource allocations for scheduling data.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

I claim:

1. A circuit comprising:
   a first filter comprising a plurality of N paths in parallel between an input and an output, each of the N paths comprising a first sub-circuit and a switch;
   a second filter comprising a plurality of N paths in parallel between an input and an output, each of the N paths comprising a second sub-circuit and a switch;
   clock signals to selectively control switches of the first filter at a same frequency for a first on-time duration, and to selectively control switches of the second filter at the same frequency for a second on-time duration, in which at least one of a) the first and second on-time durations are different, and b) the first and second sub-circuits are different; and
   a combiner for adding signals from the output of the first filter and from the output of the second filter;
   where the first filter, the second filter and the combiner together form an N-path tunable filter wherein a center frequency of a response of the N-path tunable filter is controlled by the frequency of the clock signals by shifting an amplitude of a response at the center frequency of the first filter and the second filter, and where an output of the combiner represents a difference between the amplitude of the response of the first filter and the amplitude of the response of the second filter.

2. The circuit according to claim 1, in which the clock signals that selectively control all the switches of the N paths in the first filter have the same frequency and the same first on-duration and a different phase.

3. The circuit according to claim 2, in which the first and second on-time durations are different, and the clock signals that selectively control all the switches of the N paths in the second filter have the same frequency and the same second on-duration and a different phase such that each switch in the first filter is paired with one of the switches in the second filter by clock signals having a common phase.

4. The circuit according to claim 3, further comprising a splitter for applying a same input signal to the input of the first filter and the input of the second filter.

5. The circuit according to claim 2, in which N=4 and there are a total of four different phases of the clock signal selectively controlling the switches in the first filter and the switches in the second filter.

6. The circuit according to claim 1, in which the first sub-circuit in each path of the first filter is identical to the second sub-circuit in each path of the second filter.

7. The circuit according to claim 1, in which the first sub-circuit in each path of the first filter is different from the second sub-circuit in each path of the second filter.

8. The circuit according to claim 7, in which the first and second on-time durations are identical.

9. The circuit according to claim 7, in which the first and second on-time durations are different.

10. The circuit according to claim 1, in which the circuit is operatively disposed in an electronic radio device between an antenna and one of a receiver and a transmitter.

11. The circuit according to claim 1, in which the circuit is embodied in a RF front end chip.

12. A method comprising:
providing a circuit comprising a first filter and a parallel second filter, the first filter comprising a plurality of N paths in parallel between an input and an output and each of the N paths comprising a first sub-circuit and a switch, and the second filter comprising a plurality of N paths in parallel between an input and an output and each of the N paths comprising a second sub-circuit and a switch;
selectively controlling a switch in the first filter and a switch in the second filter with clock signals having a same frequency and a same phase and respective first and second on-time durations, in which at least one of a) the first and second on-time durations are different, and b) the first and second sub-circuits are different; and
operating a combiner circuit for additively combining signal outputs of the first filter and of the second filter;
where the first filter, the second filter and the combiner circuit together form an N-path tunable filter wherein a center frequency of a response of the N-path tunable filter is controlled by the frequency o f the clock signals by shifting an amplitude of a response at the center frequency of the first filter and the second filter, and where an output of the combiner circuit represents a difference between the amplitude of the response of the first filter and the amplitude of the response of the second filter.

13. The method according to claim 12, in which selectively controlling the switch in the first filter and the switch in the second filter with the clock signals comprises selectively controlling all the switches of the N paths in the first filter with clock signals having the same frequency and the same first on-duration and a different phase.

14. The method according to claim 13, in which the first and second on-time durations are different, and selectively controlling the switch in the first filter and the switch in the second filter with the clock signals comprises selectively controlling all the switches of the N paths in the second filter with clock signals having the same frequency and the same second on-duration and a different phase such that each switch in the first filter is paired with one of the switches in the second filter by clock signals having a common phase.

15. The method according to claim 12, in which N=4 and there are a total of four different phases of the clock signal selectively controlling the switches in the first filter and the switches in the second filter.

16. The method according to claim 12, in which the first sub-circuit in each path of the first filter is identical to the second sub-circuit in each path of the second filter.

17. The method according to claim 12, in which the first sub-circuit in each path of the first filter is different from the second sub-circuit in each path of the second filter.

18. The method according to claim 17, in which the first and second on-time durations are identical.

19. The method according to claim 17, in which the first and second on-time durations are different.

20. The method according to claim 12, in which the circuit is operatively disposed in an electronic radio device between an antenna and one of a receiver and a transmitter.

* * * * *